(12) United States Patent
Chan et al.

(10) Patent No.: US 6,975,133 B1
(45) Date of Patent: Dec. 13, 2005

(54) LOGIC CIRCUITS HAVING LINEAR AND CELLULAR GATE TRANSISTORS

(75) Inventors: Victor Wing Chung Chan, New Paltz, NY (US); Hsing-Jen C. Wann, Carmel, NY (US); Shih-Fen Huang, Bedford Corners, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,784

(22) Filed: May 27, 2004

(51) Int. Cl.[7] .......................................... H03K 17/16
(52) U.S. Cl. ........................ 326/27; 326/83; 326/103
(58) Field of Search ....................... 326/26, 27, 82–86, 326/101–103

(56) References Cited

U.S. PATENT DOCUMENTS

| | | | |
|---|---|---|---|
| 4,636,825 A | 1/1987 | Baynes | 357/23.14 |
| 5,355,008 A | 10/1994 | Moyer et al. | 257/341 |
| 5,447,876 A | 9/1995 | Moyer et al. | 437/41 |
| 5,532,969 A * | 7/1996 | Houghton et al. | 365/226 |
| 6,084,266 A | 7/2000 | Jan | 257/341 |
| 6,121,657 A | 9/2000 | Yama | 257/341 |
| 6,140,687 A | 10/2000 | Shimomura et al. | 257/401 |
| 6,359,477 B1 * | 3/2002 | Pathak | 327/112 |
| 6,388,292 B1 | 5/2002 | Lin | 257/356 |
| 6,407,601 B1 * | 6/2002 | Lin | 327/158 |
| 6,548,839 B1 | 4/2003 | Strachan et al. | 257/204 |
| 6,624,679 B2 * | 9/2003 | Tomaiuolo et al. | 327/262 |

FOREIGN PATENT DOCUMENTS

JP 62-242364 10/1987

* cited by examiner

Primary Examiner—Don Le
(74) Attorney, Agent, or Firm—Ohlandt, Greeley, Ruggiero & Perle, L.L.P.; James Cioffi, Esq.

(57) ABSTRACT

A logic circuit is provided with a first inverter having a plurality of linear gate transistors driving a first capacitive load and a second inverter having a plurality of cellular gate transistors driving a second capacitive load. The first inverter is serially connected to the second inverter. The second capacitive load is larger than the first capacitive load.

19 Claims, 5 Drawing Sheets

US 6,975,133 B1

LOGIC CIRCUITS HAVING LINEAR AND CELLULAR GATE TRANSISTORS

BACKGROUND OF INVENTION

The present invention relates to logic circuits. More particularly, the present invention relates to logic circuits having linear and cellular gate transistors.

The use of complementary metal oxide silicone (MOS) transistors to perform logic functions in digital systems is common. Such logic circuits commonly require two or more inverters connected in series. For example, buffer circuits, oscillator circuits, digital circuits, memory circuits, and other logic circuits require two or more serial inverters. More complex logic circuits also use two or more inverters connected in series, but further expand the circuit to combine inverters in a partially series, partially parallel structure.

Inverters typically include a P-channel type MOS transistor (PMOS) and an N-channel type MOS transistor (NMOS). The design of the transistor can have an effect of the time delay of the logic circuit, the area or size of the circuit, and the current drive required by the circuit. The commercial success of many electronic consumer devices having such logic circuits can be dependent on, among other factors, the size, speed, and battery usage rate of the device.

Accordingly, there is a continuing need for logic circuits that are useful to reduce the size of the circuit, reduce the current drive required by the circuit, and/or increase the speed of the circuit as compared to the prior art logic circuits.

SUMMARY OF INVENTION

A logic circuit is provided having two or more inverters in series with one another, where one of the inverters drives a smaller load than the other inverter. The inverter driving the smaller load has a plurality of linear gate transistors, while the inverter driving the larger load has a plurality of cellular gate transistors.

In one embodiment of the present invention, a logic circuit is provided with a first inverter having a plurality of linear gate transistors driving a first capacitive load and a second inverter having a plurality of cellular gate transistors driving a second capacitive load. The first inverter is serially connected to the second inverter. The second capacitive load is larger than the first capacitive load.

A logic circuit is also provided with a first inverter having a plurality of linear gate transistors with a first input capacitance and a second inverter having a plurality of cellular gate transistors with a second input capacitance. The first inverter is connected in series to the second inverter. The second input capacitance is at least about one and one-half times larger than the first input capacitance.

In a further embodiment, a logic circuit is provided with a first inverter having a plurality of linear gate transistors with a first drain capacitance and a second inverter having a plurality of cellular gate transistors with a second drain capacitance. The first inverter is connected in series to the second inverter. The second drain capacitance is at least about one and one-half times larger than the first drain capacitance.

The above-described and other features and advantages of the present invention will be appreciated and understood by those skilled in the art from the following detailed description, drawings, and appended claims.

DETAILED DESCRIPTION

Figure 1:
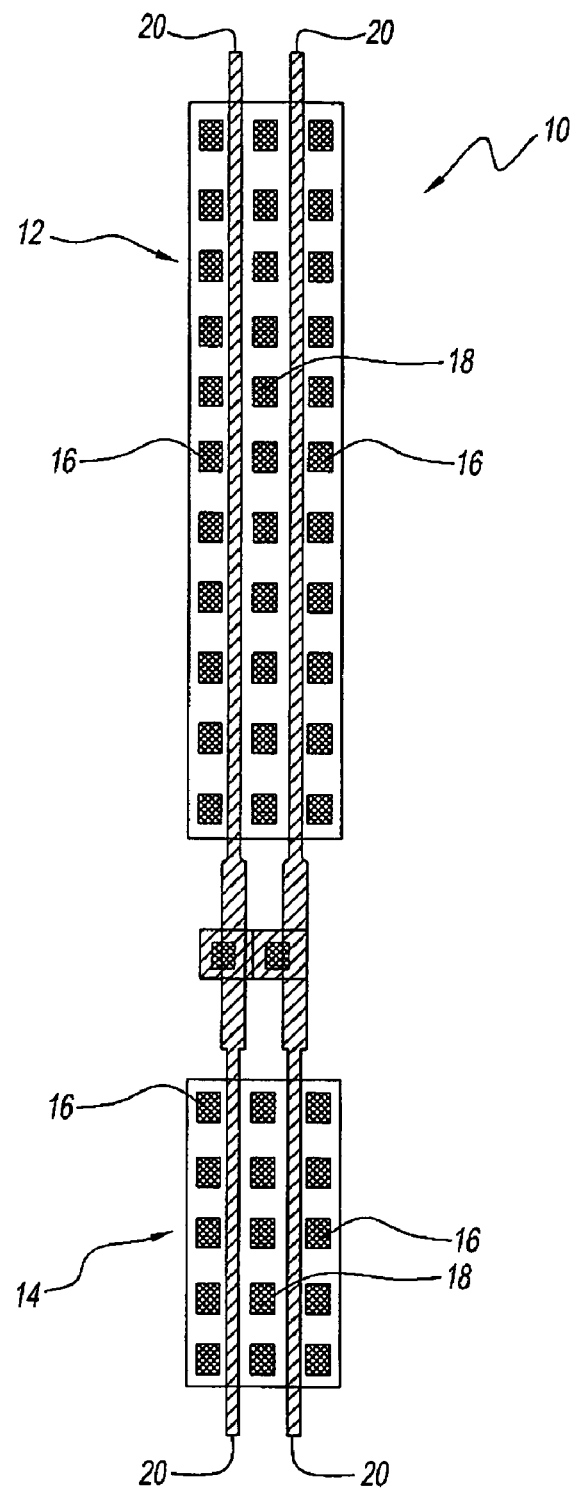
FIG. 1 is a schematic view of a first prior art inverter having linear gate transistors.

Referring now to the drawings, and in particular to FIG. 1 a first type of prior art inverter is illustrated by way of reference numeral 10. First inverter 10 has a PMOS transistor 12 and an NMOS transistor 14. Transistors 12, 14 have a plurality of source regions 16, a plurality of drain regions 18, and one or more linearly disposed gate structures 20. Source and drain regions 16, 18 are formed in alternating rows. For example, first inverter 10 is illustrated having two source regions 16 and one center drain region 18. First inverter 10 includes only one metal source interconnect (not shown) to properly bias source regions 16 and only one metal drain interconnect (not shown) to properly bias drain regions 18.

Transistors 12, 14 having linearly disposed gates structures 20 are referred to herein as "linear gate transistors". In linear gate transistors 12, 14, carriers flow from each source region 16 to one drain region 18 under gate structures 20.

Figure 2:
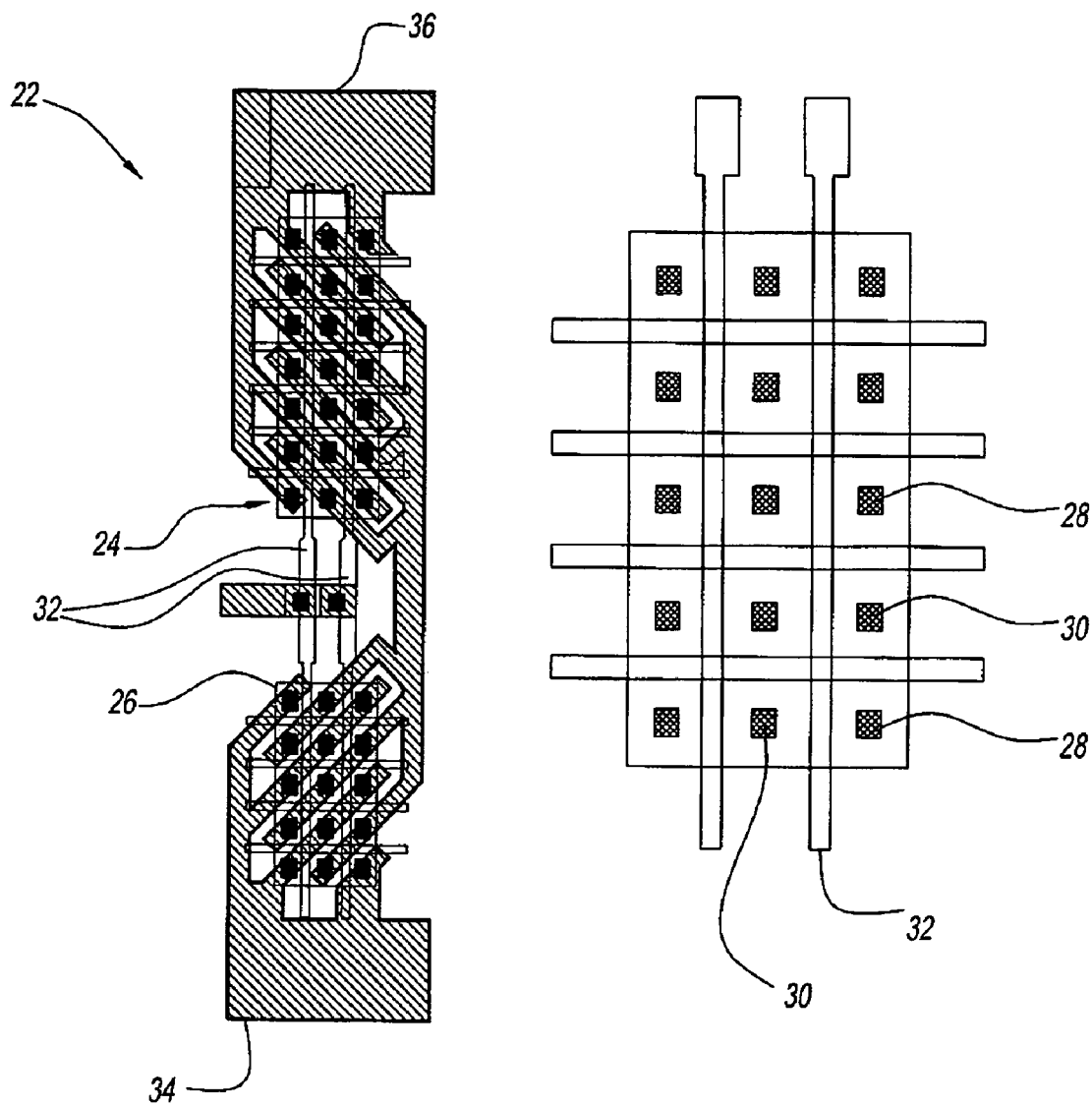
FIGS. 2 and 3 are schematic views of a second prior art inverter having cellular gate transistors.
Figure 3:
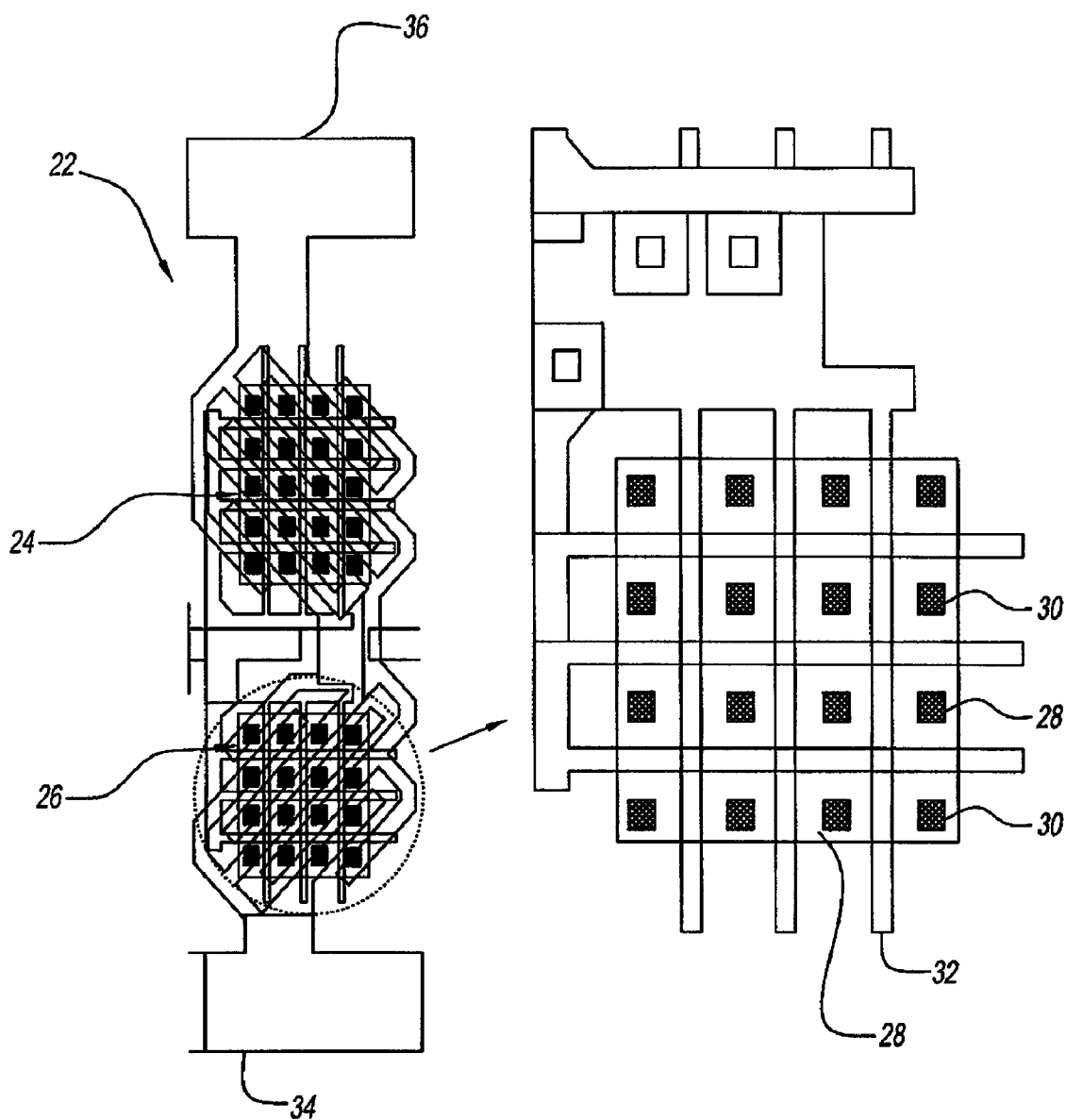

In FIGS. 2 and 3, a second type of prior art inverter is illustrated by way of reference numeral 22. Second inverter 22 has a PMOS transistor 24 and an NMOS transistor 26. Transistors 24, 26 have a plurality of source regions 28, a plurality of drain regions 30, and one or more intersecting gate structures 32. Source and drain regions 28, 30 are formed in a checker board pattern, of alternating columns and rows. Second inverter 22 includes only one metal source interconnect 34 to properly bias source regions 28 and one metal drain interconnect 36 to properly bias drain regions 30.

Transistors 24, 26 having intersecting gates structures 32 are referred to herein as "cellular gate transistors". Specifically, intersecting gate structures 32 define a plurality of cell-shaped areas about each source and drain region 28, 30. In illustrated embodiment, intersecting gate structures 32 are a plurality of intersecting horizontal and vertical conductors, which together define a plurality of square-shaped cells defined around source and drain regions 28, 30. Of course, it is contemplated by the present invention for intersecting gate structures 32 to define other non-square shapes, such as, but not limited to, a diamond shape, a rectangular shape, a triangular shape, an octagonal shape, and other polygonal shapes.

The cellular gate transistors 24, 26 of FIG. 2 include three columns of source and drain regions 28, 30, while the cellular gate transistors of FIG. 3 include four columns of source and drain regions. In each embodiment, carriers flow from source regions 28 to drain regions 30 under gates 32. However, each source region 28 is in electrical communication with two or more drain regions 30 due to the checker pattern of the source and drain regions and the intersecting gates 32.

Figure 4:
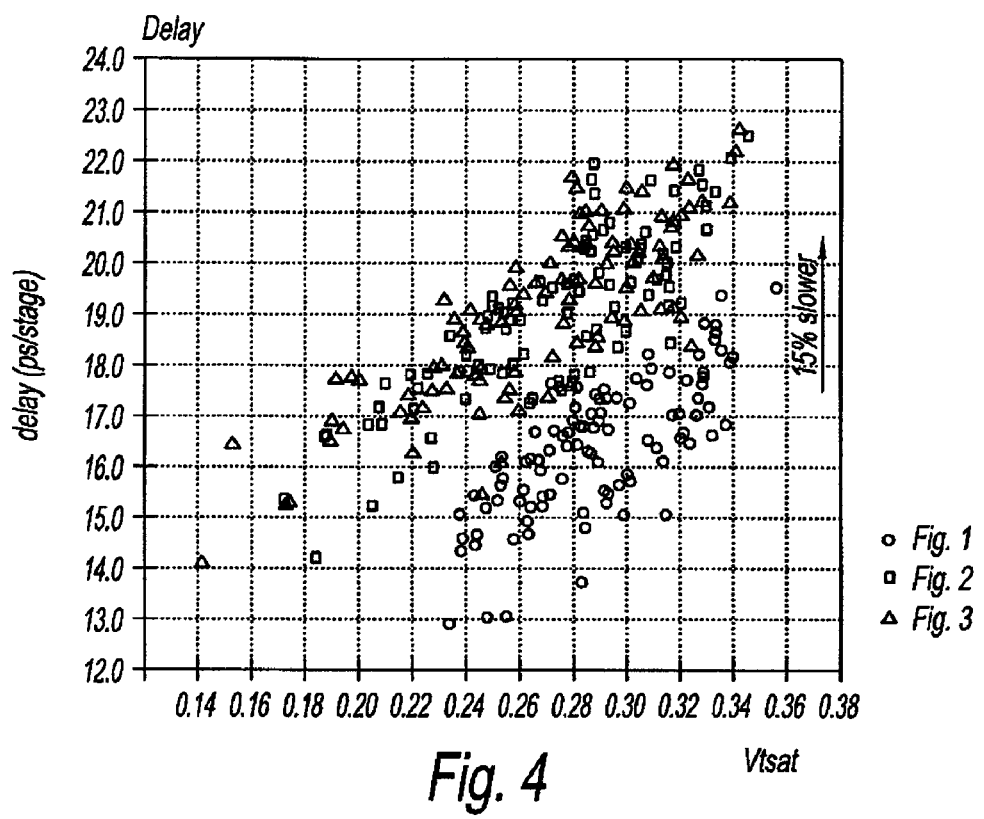
FIG. 4 is a graph according to the present invention illustrating the time delay per threshold voltage of the transistors of FIGS. 1, 2, and 3.
Figure 5:
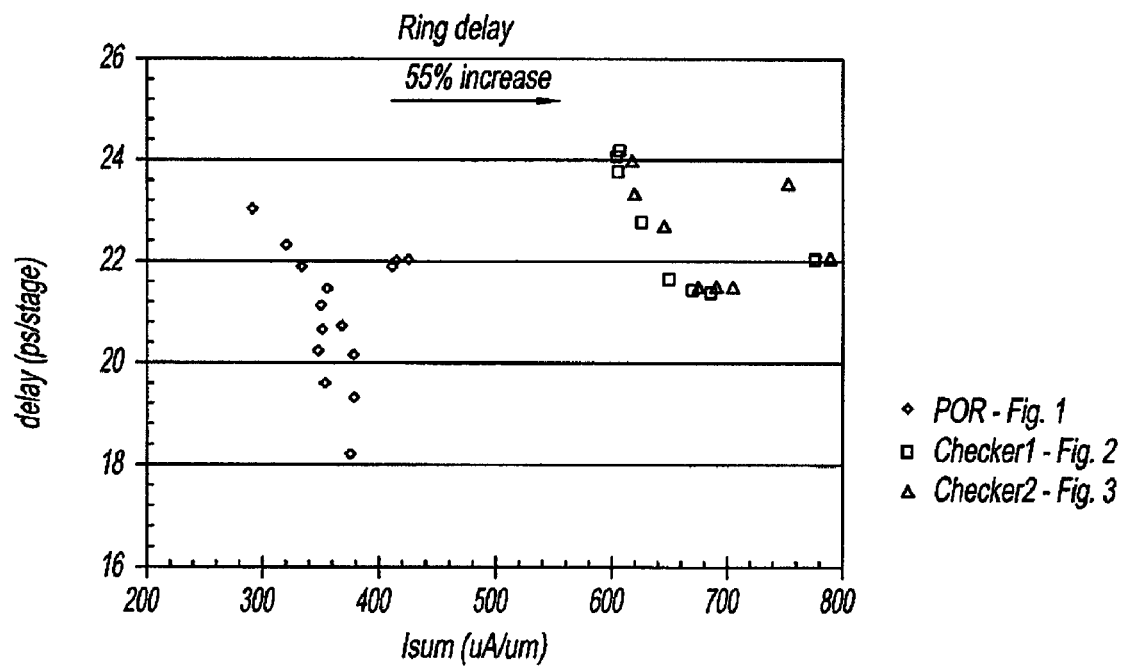
FIG. 5 is a graph according to the present invention illustrating the time delay per current of the transistors of FIGS. 1, 2, and 3.

The time delay of the first inverter 10 of FIG. 1 was compared to that of second inverters 22 of FIGS. 2 and 3, where the inverters all had similar layout areas. The ring delay in picoseconds per stage at different threshold voltages is shown in FIG. 4. Further, the ring delay in picoseconds per stage at different currents is shown in FIG. 5.

From the data of FIG. 4, it was determined that second inverters 22 have a longer delay (i.e., slower) as compared to first inverter 10. However, it was determined from the data of FIG. 5 that second inverters 22 provide higher total drive current as compared to first inverter 10.

Importantly, it was determined that the speed decrease and the high current in second inverters 22 are due to the extra capacitance available from the cellular gate transistors 24, 26. Specifically, cellular gate transistors 24, 26 provide between about 20% to about 80% higher drive current, more particularly about 55% higher drive current than linear gate transistors 12, 14. It can also be seen from FIG. 4 that cellular gate transistors 24, 26 have a delay that is about 15% slower than linear gate transistors 12, 14. Since the delay is equal to the capacitance times the voltage divided by the current, it was found that second inverters 22 have about 1.5 to about 3 times higher load capacitance than similar sized first inverter 10.

Figure 6:
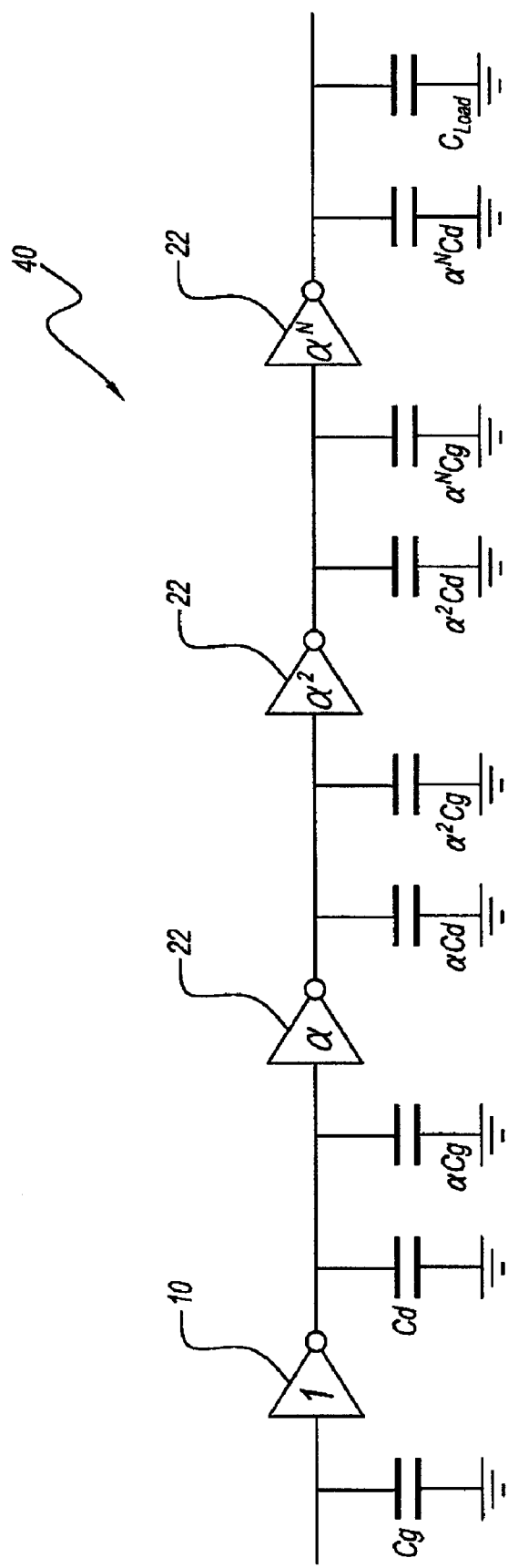
FIG. 6 is an exemplary embodiment of a logic circuit according to the present invention having linear and cellular gate transistors.

An exemplary embodiment of a logic circuit 40 taking advantage of the above data is illustrated in FIG. 6. In this embodiment, logic circuit 40 is illustrated as a buffer circuit. Advantageously, logic circuit 40 combines one or more first inverters 10 having linear gate transistors 12, 14 with one or more second inverters 22 having cellular gate transistors 24, 26. In addition, logic circuit 40 is configured so that the delay time is minimized.

By way of example, the steps for configuring logic circuit 40 to minimize the delay time is illustrated below in comparison to conventional (e.g., having only first inverter 10). During design of conventional buffer circuits, $C_{load}$ is the load capacitance of the circuit, Cg is the input capacitance, Cd is the drain capacitance, N the number of inverter stages, $T_{total}$ is the total delay time, $T_0$ is the initial time delay, and k is the constant scale factor for the inverters in the chain. It can be assumed that the load capacitance of the circuit is as follows:

$$C_{load} = k^{N+1} Cg \quad \text{(Equation 1)}$$

Where the total delay time from the input terminal to the load capacitance node is defined by:

$$T_{total} = (N+1) T_o \frac{(Cd + kCg)}{(Cd + Cg)} \quad \text{(Equation 2)}$$

By combining Equations 1 and 2, it can be seen that:

$$T_{total} = \frac{\ln(Cl/Cg)}{(\ln k)} T_o \frac{(Cd + kCg)}{(Cd + Cg)} \quad \text{(Equation 3)}$$

To minimize the delay, the total delay divided by the scale factor can be set to zero such that:

$$\text{Delta}(T_{total})/\text{Delta}(k) = 0 \quad \text{(Equation 4)}$$

By combining Equations 3 and 4, it can be seen that:

$$T_0 \ln(Cl/Cg) \left[ \frac{-1/k}{(\ln k)^2} \left( \frac{Cd + kcg}{Cd + Cg} \right) + \left( \frac{Cg}{Cd + Cg} \right) \right] = 0 \quad \text{(Equation 5)}$$

The solution to Equation 5 results in:

$$k(\ln k - 1) = Cd/Cg \quad \text{(Equation 6)}$$

Assuming for the conventional buffer circuit that Cd=5 fF (femto Farads), Cg=10 fF (femto Farads), and $C_{load}$= 50 pF (pico Farads), k=3.18 and N=6.36. Since N is the number of inverters, this value is rounded up to the largest whole number, namely 7.

In contrast, for logic circuit 40 having first and second inverters 10, 22, Cd is about 1.5 to about 2 times higher than for the linear gate transistors as estimated based on the layout area of the logic circuit, and Cg is about 1.5 to about 3 times higher than the linear gate transistors as estimated based on the layout area of the logic circuit. Thus, where Cd is 2 times larger (5 fF×2=10 fF), Cg is 3 times larger (10 fF×3=30 fF), and where $C_{load}$ remains 50 pF. In this example, k=3.03 and N=6.68, which is again rounded up to the largest whole number 7. As can be seen from the above comparison, the number of inverter stages (i.e., N) and the constant scale factor (i.e., k) differ in logic circuit 40 having first and second inverters 10, 22 as compared to similar sized circuits having only one type of inverter.

Accordingly, logic circuit 40 takes unique advantage of the benefits of cellular and liner gate transistors to improve the function of the logic circuit. Here, logic circuit 40 has two or more inverters in series with one another, where one of the inverters drives a smaller load than the other inverter. The inverter driving the smaller load has linear gate transistors, while the inverter driving the larger load has cellular gate transistors.

In addition, it should be noted that the terms "first", "second", "third", "upper", "lower", and the like may be used herein to modify various elements. These modifiers do not imply a spatial, sequential, or hierarchical order to the modified elements unless specifically stated.

While the present invention has been described with reference to one or more exemplary embodiments, it will be understood by those skilled in the art that various changes may be made and equivalents may be substituted for elements thereof without departing from the scope of the present invention. In addition, many modifications may be made to adapt a particular situation or material to the teachings of the invention without departing from the scope thereof. Therefore, it is intended that the present invention not be limited to the particular embodiment(s) disclosed as the best mode contemplated, but that the invention will include all embodiments falling within the scope of the appended claims.

What is claimed is:

1. A logic circuit comprising:
    a first inverter having a plurality of linear gate transistors driving a first capacitive load; and
    a second inverter having a plurality of cellular gate transistors driving a second capacitive load, said second inverter being connected in series with said second inverter, wherein said second capacitive load is larger than said first capacitive load.

2. The logic circuit as in claim 1, wherein said second capacitive load is between about 1.5 to about 3 times larger than said first capacitive load.

3. The logic circuit as in claim 1, further comprising a plurality of first inverters and/or a plurality of second inverters.

4. The logic circuit as in claim 1, wherein the logic circuit is a circuit selected from the group consisting of a buffer circuit, an oscillator circuit, a digital circuit, and a memory circuit.

5. The logic circuit as in claim 1, wherein said plurality of cellular gate transistors comprise a plurality of cells each having a shape selected from the group consisting of a diamond, a square, a rectangle, a triangle, an octagon, and any combinations thereof.

6. A logic circuit comprising:
   a first inverter having a plurality of linear gate transistors with a first input capacitance; and
   a second inverter being connected in series to said first inverter, said second inverter having a plurality of cellular gate transistors with a second input capacitance, wherein said second input capacitance is at least about one and one-half times larger than said first input capacitance.

7. The logic circuit as in claim 6, wherein said second input capacitance is about three times larger than said first input capacitance.

8. The logic circuit as in claim 6, wherein said first inverter has a first drain capacitance and said second inverter has a second drain capacitance, wherein said second drain capacitance is at least about one and one-half times larger than said first drain capacitance.

9. The logic circuit as in claim 8, wherein said second drain capacitance is about two times larger than said first drain capacitance.

10. The logic circuit as in claim 6, wherein said plurality of cellular gate transistors comprise a plurality of cells each having a shape selected from the group consisting of a diamond, a square, a rectangle, a triangle, an octagon, and any combinations thereof.

11. The logic circuit as in claim 6, wherein said first inverter drives a first capacitive load and said second inverter drives a second capacitive load, said second capacitive load being larger than said first capacitive load.

12. The logic circuit as in claim 11, wherein said second capacitive load is between about 1.5 to about 3 times larger than said first capacitive load.

13. A logic circuit comprising:
   a first inverter having a plurality of linear gate transistors with a first drain capacitance; and
   a second inverter being connected in series to said first inverter, said second inverter having a plurality of cellular gate transistors with a second drain capacitance, wherein said second drain capacitance is at least about one and one-half times larger than said first drain capacitance.

14. The logic circuit as in claim 13, wherein said second drain capacitance is about two times larger than said first drain capacitance.

15. The logic circuit as in claim 14, wherein said first inverter has a first input capacitance and said second inverter has a second input capacitance, said second input capacitance being at least about one and one-half times larger than said first input capacitance.

16. The logic circuit as in claim 15, wherein said second input capacitance is about three times larger than said first input capacitance.

17. The logic circuit as in claim 13, wherein said first inverter drives a first capacitive load and said second inverter drives a second capacitive load, said second capacitive load being larger than said first capacitive load.

18. The logic circuit as in claim 17, wherein said second capacitive load is between about 1.5 to about 3 times larger than said first capacitive load.

19. The logic circuit as in claim 18, wherein the logic circuit is a circuit selected from the group consisting of a buffer circuit, an oscillator circuit, digital circuits, and memory circuits.

* * * * *